(12) United States Patent
Tanaka

(10) Patent No.: US 10,340,944 B2
(45) Date of Patent: Jul. 2, 2019

(54) FLOATING-POINT ADDER, SEMICONDUCTOR DEVICE, AND CONTROL METHOD FOR FLOATING-POINT ADDER

(71) Applicant: Renesas Electronics Corporation, Tokyo (JP)

(72) Inventor: Katsunori Tanaka, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 35 days.

(21) Appl. No.: 15/012,896

(22) Filed: Feb. 2, 2016

(65) Prior Publication Data

US 2016/0248439 A1    Aug. 25, 2016

(30) Foreign Application Priority Data

Feb. 25, 2015 (JP) ................................ 2015-035141

(51) Int. Cl.
| | | |
|---|---|---|
| *H03M 7/24* | (2006.01) | |
| *G06F 7/485* | (2006.01) | |
| *H03M 7/30* | (2006.01) | |

(52) U.S. Cl.
CPC ............... *H03M 7/24* (2013.01); *G06F 7/485* (2013.01); *H03M 7/6017* (2013.01); *H03M 7/6029* (2013.01)

(58) Field of Classification Search
CPC .......... G06F 7/485; G06F 7/505; G06F 7/506; H03M 7/24

(Continued)

(56) References Cited

U.S. PATENT DOCUMENTS

| | | | |
|---|---|---|---|
| 4,751,665 A | | 6/1988 | Cappello et al. |
| 5,941,938 A | * | 8/1999 | Thayer ................. G06F 7/5095 708/490 |

(Continued)

FOREIGN PATENT DOCUMENTS

| | | |
|---|---|---|
| JP | 62-202232 A | 9/1987 |
| JP | 11-102353 A | 4/1999 |

OTHER PUBLICATIONS

Syed Zohaib Gilani, Compute Efficient Embedded Processors, Doctor of Philosophy dissertation, University of Wisconsin—Madison, 2012.*

(Continued)

*Primary Examiner* — Andrew Caldwell
*Assistant Examiner* — Emily E LaRocque
(74) *Attorney, Agent, or Firm* — Mattingly & Malur, PC

(57) ABSTRACT

An object of the invention is to speed up processing of adding floating-point numbers. A floating-point adder includes: a first register configured to store a first fixed-point number having a predetermined number of digits corresponding to a result of accumulation of a plurality of floating-point numbers; a first conversion unit configured to convert an input first floating-point number into a second fixed-point number having the predetermined number of digits; a second register configured to store the second fixed-point number; an adder configured to add the second fixed-point number stored in the second register and the first fixed-point number stored in the first register, and store a result of the addition in the first register as the first fixed-point number; and a second conversion unit configured to convert the first fixed-point number into a second floating-point number, and output the second floating-point number.

11 Claims, 12 Drawing Sheets

(58) Field of Classification Search
USPC .......................................... 708/204, 505, 670
See application file for complete search history.

(56) References Cited

U.S. PATENT DOCUMENTS

| | | | |
|---|---|---|---|
| 7,293,056 B2* | 11/2007 | Sheaffer | G06F 9/30014 |
| | | | 708/709 |
| 2006/0242221 A1* | 10/2006 | McDaniel | G06F 7/607 |
| | | | 708/700 |

OTHER PUBLICATIONS

Bogdan Pasca, et al, An FPGA Specific Approach to Floating-Point Accumulation of Sum of Products, LIP Research REport RR2009-22, ensl-00268348, version 3-11, 1008.*

Yao Tao, et al, Correctly Rounded Architectures for Floating-Point Multi-Operand Addition and Dot-Product Computation, ASAP IEEE, 2013.*

Renesas, ADAS Surround View Kit, Users Manual: Hardware, Surround view application board (for ADAS Starter Kit) rev 1.00, Nov. 2015.*

Japanese Office Action received in corresponding Japanese Application No. 2015-035141 dated Jul. 24, 2018.

* cited by examiner

| | FIRST CYCLE | SECOND CYCLE | THIRD CYCLE | FOURTH CYCLE | FIFTH CYCLE |
|---|---|---|---|---|---|
| OPERAND OF FIRST ACCUMULATION INSTRUCTION | CALCULATION OF SIGNED FIXED-POINT NUMBER | ARITHMETIC LEFT SHIFT | ADDITION/ SUBTRACTION | CALCULATION OF ABSOLUTE VALUE | LZD, ARITHMETIC LEFT SHIFT, ROUNDING PROCESSING, EXPONENT SUBTRACTION |
| OPERAND OF SECOND ACCUMULATION INSTRUCTION | | CALCULATION OF SIGNED FIXED-POINT NUMBER | ARITHMETIC LEFT SHIFT | ADDITION/ SUBTRACTION | CALCULATION OF ABSOLUTE VALUE |
| OPERAND OF THIRD ACCUMULATION INSTRUCTION | | | CALCULATION OF SIGNED FIXED-POINT NUMBER | ARITHMETIC LEFT SHIFT | ADDITION/ SUBTRACTION |
| OPERAND OF FOURTH ACCUMULATION INSTRUCTION | | | | CALCULATION OF SIGNED FIXED-POINT NUMBER | ARITHMETIC LEFT SHIFT |
| OPERAND OF FIFTH ACCUMULATION INSTRUCTION | | | | | CALCULATION OF SIGNED FIXED-POINT NUMBER |

Fig. 5

RELATED ART

FLOATING-POINT ADDER, SEMICONDUCTOR DEVICE, AND CONTROL METHOD FOR FLOATING-POINT ADDER

CROSS-REFERENCE TO RELATED APPLICATIONS

This application is based upon and claims the benefit of priority from Japanese patent application No. 2015-035141, filed on Feb. 25, 2015, the disclosure of which is incorporated herein in its entirety by reference.

BACKGROUND

The present invention relates to a floating-point adder, a semiconductor device, and a control method for a floating-point adder. For example, the present invention relates to a floating-point adder, a semiconductor device, and a control method for a floating-point adder for adding floating-point numbers.

An image recognition program extracts feature vectors from an image and makes a determination and calculation of the feature vectors using dictionary vectors for determination. The main operation in the determination calculation is a calculation of a high-dimensional vector dot product. A vector dot product is calculated by continuously performing a huge number of product-sum arithmetic operations. To efficiently execute the processing of continuously performing product-sum arithmetic operations, an addition is performed by an accumulator including a register that holds previous accumulation results. It is necessary to perform the addition in one cycle so that the accumulation is performed every cycle. The floating-point representation has a large dynamic range, and thus the floating-point representation has been mainly used as a way of representing vector elements. A floating point is a number representation composed of a 1-bit sign, an exponent and a mantissa of a fixed length.

Japanese Unexamined Patent Application Publication No. H11-102353 discloses a technique relating to a floating point product sum arithmetic logic unit. The floating point product sum arithmetic logic unit disclosed in Japanese Unexamined Patent Application Publication No. H11-102353 includes a floating-point multiplier, a digit alignment shifter, a mantissa adder, and an intermediate result register. The digit alignment shifter aligns the digits of the intermediate result of the previous product-sum arithmetic operation, which is stored in the intermediate result register, and the digits of the multiplication result of the floating-point multiplier. The mantissa adder adds the two mantissas, the digits of which are aligned by the digit alignment shifter, and stores the addition result in the intermediate result register as the intermediate result of the product-sum arithmetic operation.

SUMMARY

The technique disclosed in Japanese Unexamined Patent Application Publication No. H11-102353 requires a shifter for digit alignment so as to perform processing of adding the floating-point numbers of the intermediate result of the previous product-sum arithmetic operation and the current multiplication result. Accordingly, there is a problem that a path delay in the part of the adder for adding floating-point numbers is long. Other problems to be solved by and novel features of the present invention will become apparent from the following description and the accompanying drawings.

A first aspect of the present invention is a floating-point adder configured to perform addition/subtraction of operands after performing type-conversion of the operands into fixed-point numbers, and reversely convert a fixed-point number obtained as a result of the addition/subtraction into a floating-point number.

According to the first aspect of the present invention, processing of adding floating-point numbers can be achieved at a high speed.

BRIEF DESCRIPTION OF THE DRAWINGS

The above and other aspects, advantages and features will be more apparent from the following description of certain embodiments taken in conjunction with the accompanying drawings, in which:

FIG. 5 is a timing diagram showing a flow of the floating-point addition processing according to the second embodiment;

DETAILED DESCRIPTION

Figure 1:
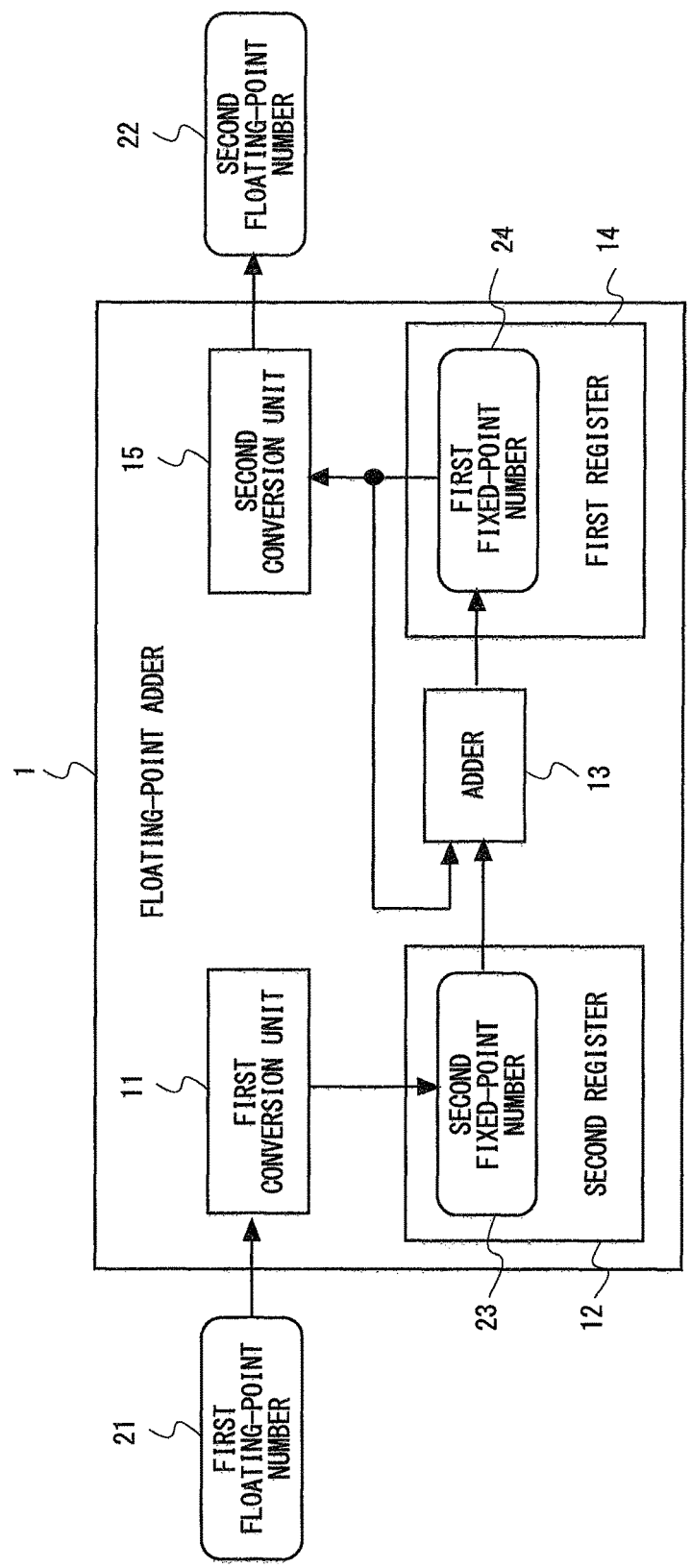
FIG. 1 is a block diagram showing a configuration of a floating-point adder according to a first embodiment.

Specific embodiments to which means for solving the above-mentioned problem are applied will be described in detail below with reference to the drawings. In the drawings, the same elements are denoted by the same reference numerals, and a repeated description is omitted as needed.

In the following embodiments, explanations are made by referring to several sections or several embodiments for convenience, as required, but they are mutually related, and are in such a relation to each other that one of them is a modified example, an application example, a detailed explanation, a supplemental explanation, or the like of a part or all of the other, unless otherwise specified. Further, in the following embodiments, when the number of elements (including the number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated or it is theoretically clear that the above is not true. This also applies to the above-mentioned values (including the number of items, numerical value, quantity, range, etc.) and the like.

The problem to be solved by the invention will now be described in detail. Along with an improvement in operation performance and a reduction in power consumption per performance in the field of image recognition, devices for performing image recognition processing that requires a huge number of operations have been mounted in built-in equipments.

The image recognition processing is roughly divided into two steps. A first step is a step of calculating, as a feature vector, a pattern representing a shape of an object depicted in an image. An example of the feature vector is a vector indicating the presence or absence of a boundary and the direction (angle) of the boundary for each pixel obtained by performing processing for extracting a background and a boundary of an object from an image. A second step is a step of determining whether an object to be detected is recognized or not based on the feature vector calculated from the image and the typical feature vector of the object to be detected.

In the image recognition processing, various vector operations are carried out. A calculation of a dot product has an important role among the vector operations. For example, the object to be detected is viewed in various ways depending on its angle and environment, so that a large number of feature vectors are combined into information to generalize the feature vectors. This information is represented as a weight vector indicating a weight for each element of the feature vector calculated from the image. In the determination processing, the dot product of the feature vector of the image and the weight vector of the object to be detected is calculated, and it is determined whether the value obtained as a result of the calculation exceeds a threshold.

Since extremely high-dimensional feature vectors are used in the image recognition processing, it is important that the processing of continuously performing product-sum arithmetic operations, which are repeated a large number of times in a calculation of a dot product, be performed at a high speed.

Each element of feature vectors may have any data type. However, in recent years, a floating-point type has been used in many cases. For this reason, it is especially important to perform the processing of continuously performing product-sum arithmetic operations on floating-point numbers at a high speed.

Figure 10:
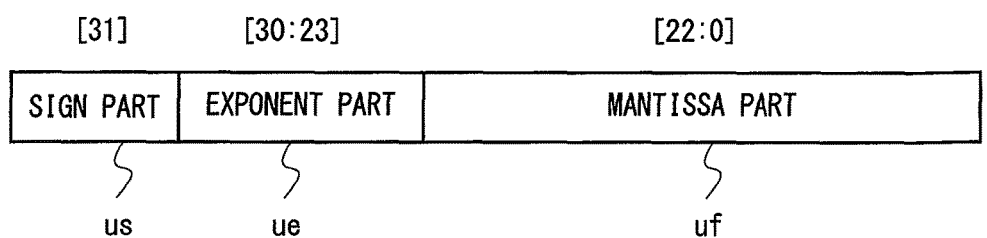
FIG. 10 is a diagram for explaining a floating-point number representation in the IEEE 754 single-precision format.

FIG. 10 is a diagram for explaining a floating-point number representation in the IEEE (Institute of Electrical and Electronics Engineers, Inc) 754 single-precision format. Specifically, a floating-point number includes a sign part "us", an exponent part "ue", and a mantissa part "uf". In the IEEE 754 single-precision format, a value is expressed by the following formula (1) when the sign is represented by "s", the exponent is represented by "e", and the mantissa is represented by "f".

$$(-1)^s \times f \times 2^e \quad (1)$$

Note that the sign "s" is expressed as s={0,1}; the exponent "e" is an arbitrary integer; and the mantissa is a fixed-point number in the range of $1 \leq f \leq 2$. The IEEE 754 format uses a representation of a bit length that varies depending on the precision of the operation. In the above-mentioned single-precision representation, the most significant bit of the sign part "us" is 1 bit; the exponent part "ue" is 8 bits; the mantissa part "uf" is 23 bits; and the floating-point number is 32 bits in total. In a double-precision representation, the exponent part is 11 bits; the mantissa part is 52 bits; and the total number of bits is 64 bits.

Addition/subtraction operations of the floating-point type are complex, unlike those of the integer type and the fixed-point type. This is because, unlike the integer type and the fixed-point type, floating-point numbers require digit alignment processing based on an exponent difference prior to the addition/subtraction of mantissas, and also require normalization after the addition/subtraction of mantissas.

In the standardized IEEE 754 format, a mantissa part needs to be represented by a fixed-point number which is equal to or greater than 1 and less than 2, as a rule. Accordingly, if exponent parts are different, mantissa parts cannot be directly added or subtracted, and thus it is necessary to preliminarily perform digit alignment. The digit alignment is an operation in which when there is a difference between the exponents of two summands, the smaller exponent is set to be equal to the larger one and the mantissa of the smaller one is divided by an (exponent difference)-th power of two ($2^n$ where n is an exponent difference) (right shift by the number of bits corresponding to the exponent difference). Through this operation, the addition/subtraction of the mantissa parts obtained after the digit alignment can be performed, so that the mantissa can be obtained as the intermediate result of the operation result. Further, the larger exponent can be obtained as the exponent serving as the intermediate result of the operation result.

In some cases, the addition/subtraction result may show a mantissa part of less than 1. Accordingly, there is a need for normalization processing in which the mantissa is multiplied by a power of 2 and the exponent part is subtracted by the value obtained by multiplying the mantissa, so that the addition/subtraction result becomes equal to or greater than 1 and less than 2.

Figure 11:
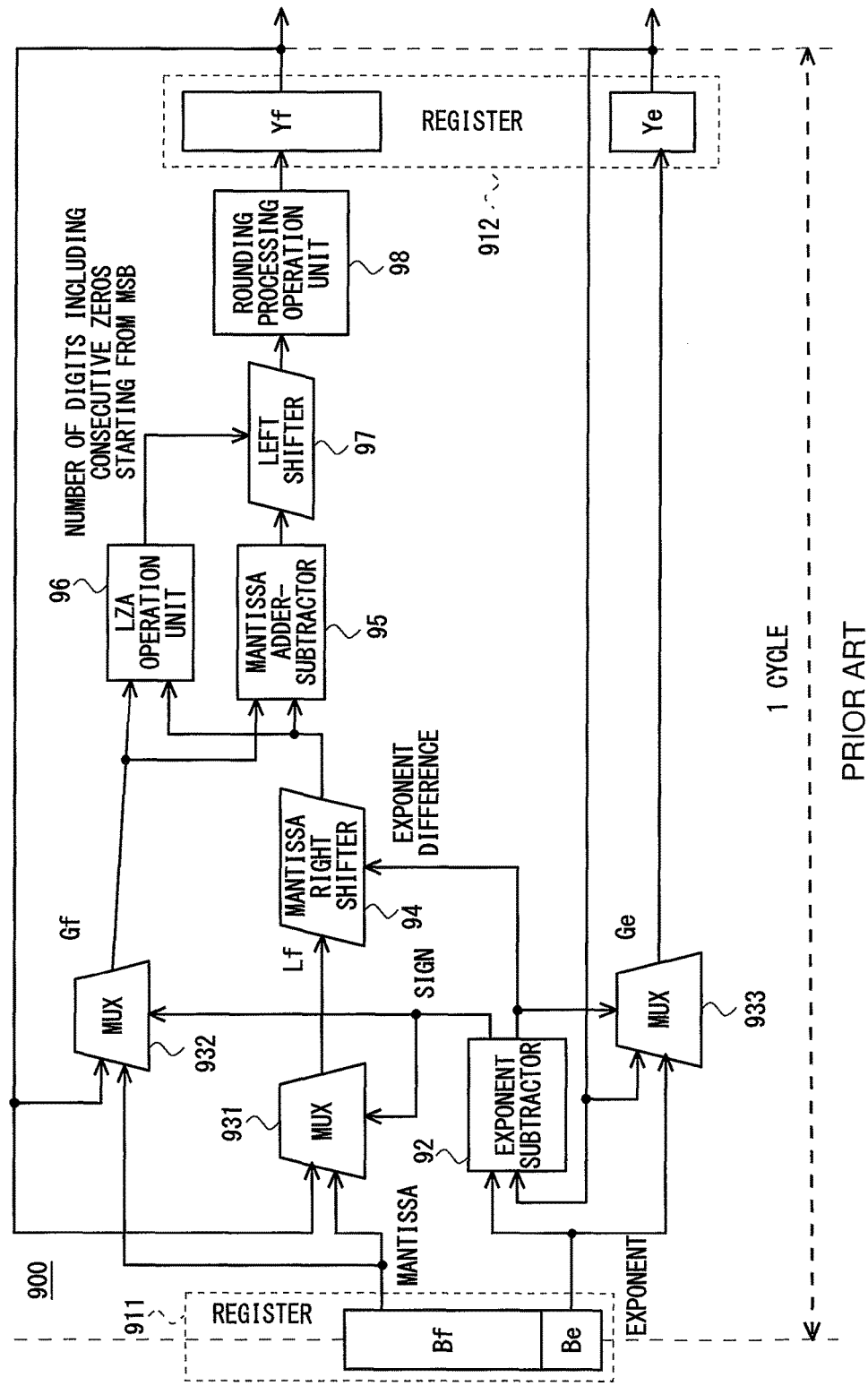
FIG. 11 is block diagram showing a configuration of a floating-point adder according to the related art.

FIG. 11 is a block diagram showing a configuration of a general floating-point adder 900. The floating-point adder 900 includes registers 911 and 912, an exponent subtractor 92, multiplexers (MUXs) 931, 932, and 933, a mantissa right shifter 94, a mantissa adder-subtractor 95, a LZA (Leading Zero Anticipator) operation unit 96, a left shifter 97, and a rounding processing operation unit 98. The register 911 holds the floating-point numbers to be added that are input from the outside. The register 911 stores a mantissa part Bf and an exponent part Be. The register 912 holds the floating-point number as a result of the addition by the floating-point adder 900. The register 912 stores a mantissa part Yf and an exponent part Ye. The mantissa part Yf and the exponent part Ye are intermediate results obtained by accumulating a plurality of floating-point numbers. Note that in FIG. 11, the sign part is omitted.

The exponent subtractor 92 receives the input of the exponent part Be and the exponent part Ye, and calculates the difference between the exponent part Be and the exponent part Ye. The exponent subtractor 92 outputs the sign of the calculated difference to the multiplexers 931 and 932. The exponent subtractor 92 outputs the calculated difference (exponent difference) to the mantissa right shifter 94.

The multiplexer 931 selects a mantissa Lf with a smaller exponent from the mantissa part Bf and the mantissa part Yf based on the sign (of the exponent difference) received from the exponent subtractor 92, and outputs the mantissa Lf to the mantissa right shifter 94. The multiplexer 932 selects a mantissa Gf with a larger exponent from the mantissa part Bf and the mantissa part Yf based on the sign (of the exponent difference) received from the exponent subtractor 92, and outputs the mantissa Gf to the mantissa adder-subtractor 95 and the LZA operation unit 96. Further, the multiplexer 933 selects an exponent Ge with a larger exponent from the exponent part Be and the exponent part Ye based on the sign (of the exponent difference) received from the exponent subtractor 92, and stores the exponent Ge in the register 912 as the exponent part Ye.

The mantissa right shifter 94 shifts the mantissa Lf, which is received from the multiplexer 931, to the right by an amount corresponding to the exponent difference, and outputs the mantissa Lf to the mantissa adder-subtractor 95 and the LZA operation unit 96. In other words, the mantissa right shifter 94 shifts the smaller one of the mantissa part Bf and the mantissa part Yf to the right by the amount corresponding to the exponent difference.

When the signs of operands are the same, the mantissa adder-subtractor 95 performs addition of the input mantissas. When the signs of operands are different, the mantissa adder-subtractor 95 performs subtraction of the input mantissas. Specifically, the mantissa adder-subtractor 95 performs addition or subtraction of the mantissa Gf and the mantissa Lf obtained after the right shift, and outputs the addition/subtraction result to the left shifter 97.

The LZA operation unit 96 has, as an input, the mantissas (the mantissa Gf and the mantissa Lf obtained after the right shift) before the addition/subtraction, predicts the number of bits including consecutive zeros starting from the most significant bit (MSB) of the addition/subtraction result, and outputs the number of bits to the left shifter 97.

The left shifter 97 shifts the addition/subtraction result, which is received from the mantissa adder-subtractor 95, to the left by an amount corresponding to the number of bits received from the LZA operation unit 96, and outputs the shift result to the rounding processing operation unit 98. The rounding processing operation unit 98 performs rounding processing for fractions equal to or less than the bit width of the mantissa part on the shift result received from the left shifter 97, and stores the processing result in the register 912 as the mantissa part Yf. Accordingly, the mantissa part Yf and the exponent part Ye are objects to be calculated with the floating-point number to be subsequently input, and are intermediate results of the accumulation.

Figure 12:
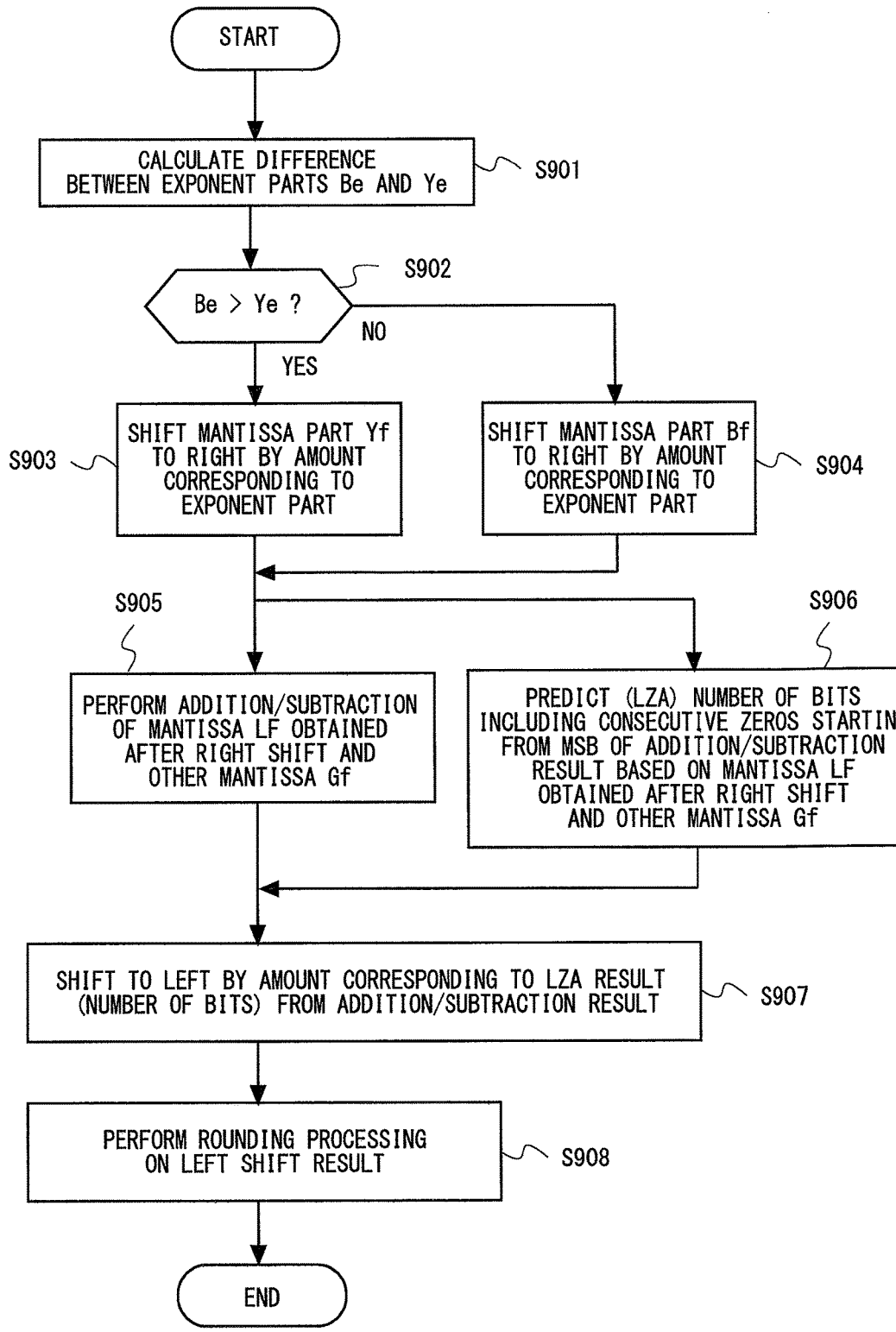
FIG. 12 is a flowchart showing floating-point addition processing according to the related art.

FIG. 12 is a flowchart showing a flow of the above-mentioned floating-point addition processing by the floating-point adder 900. First, the exponent subtractor 92 calculates the difference between the exponent part Be and the exponent part Ye (S901). Next, the magnitude of the exponent part Be and the magnitude of the exponent part Ye are determined based on the difference between the exponent parts. When the exponent part Be is larger than the exponent part Ye, the mantissa right shifter 94 shifts the mantissa part Yf to the right by an amount corresponding to the difference between the exponent parts (S903). On the other hand, when the exponent part Ye is larger than the exponent part Be, the mantissa right shifter 94 shifts the mantissa part Bf to the right by an amount corresponding to the difference between the exponent parts (S904).

Subsequently, the mantissa adder-subtractor 95 performs addition/subtraction of the mantissa Lf obtained after the right shift and the other mantissa Gf (S905). In parallel, the LZA operation unit 96 predicts the number of bits including consecutive zeros starting from the MBS of the addition/subtraction result, based on the mantissa Lf obtained after the right shift and the other mantissa Gf (S906).

After that, the left shifter 97 shifts the addition/subtraction result to the left by an amount corresponding to (the number of bits of) the result of the LZA (S907). The rounding processing operation unit 98 performs rounding processing on the left shift result (S908).

Since the typical floating-point addition processing as described above is complex, a delay in the arithmetic circuit of the floating-point adder 900 is long. Accordingly, there is a problem that the performance of processing of continuously performing product-sum arithmetic operations about floating-point deteriorates.

In order to perform the floating-point addition of the processing of continuously performing product-sum arithmetic operations in one cycle, it is necessary to lower the clock frequency due to a long circuit delay. Accordingly, the entire system performance is also lowered. In this case, the mantissa right shift for digit alignment, the addition/subtraction, and the mantissa left shift for normalization are required. However, in general, a shift operation unit capable of shifting any number of bits has a circuit delay equivalent to a delay in a multiplier, which results in an extremely long path delay.

To avoid such a problem, the circuit can be configured so that floating-point additions are pipelined and performed in a plurality of cycles. However, for example, when the additions are carried out in two cycles, the processing of continuously performing product-sum arithmetic operations cannot be carried out every cycle. This is because, if an operand is input every cycle, the accumulation result of the previous operation cannot be obtained in the cycle in which the multiplication is completed. Accordingly, the operation is carried out only once in two cycles, with the result that the performance is decreased by half.

Embodiments for solving the above-mentioned problems will be described below.

First Embodiment

FIG. 1 is a block diagram showing a configuration of a floating-point adder 1 according to a first embodiment of the present invention. The floating-point adder 1 accumulates a plurality of floating-point numbers. In particular, the floating-point adder 1 according to the first embodiment employs a system in which addition/subtraction of operands is performed after type-conversion of the operands into fixed-point numbers, and a fixed-point number obtained as a result of the addition/subtraction is reversely converted into a floating-point number.

The floating-point adder 1 includes a first conversion unit 11, a second register 12, an adder 13, a first register 14, and a second conversion unit 15. The first register 14 preliminarily stores a first fixed-point number 24 with a predetermined number of digits corresponding to the result of accumulation of the plurality of floating-point numbers. The first conversion unit 11 converts a first floating-point number 21 to be input into a second fixed-point number 23 with a predetermined number of digits. The second register 12 stores the second fixed-point number 23. The adder 13 adds the second fixed-point number 23 stored in the second register 12 and the first fixed-point number 24 stored in the first register 14, and stores the addition result in the first register 14 as the first fixed-point number 24. The second conversion unit 15 converts the first fixed-point number 24 into a second floating-point number 22, and outputs the second floating-point number 22.

Figure 2:
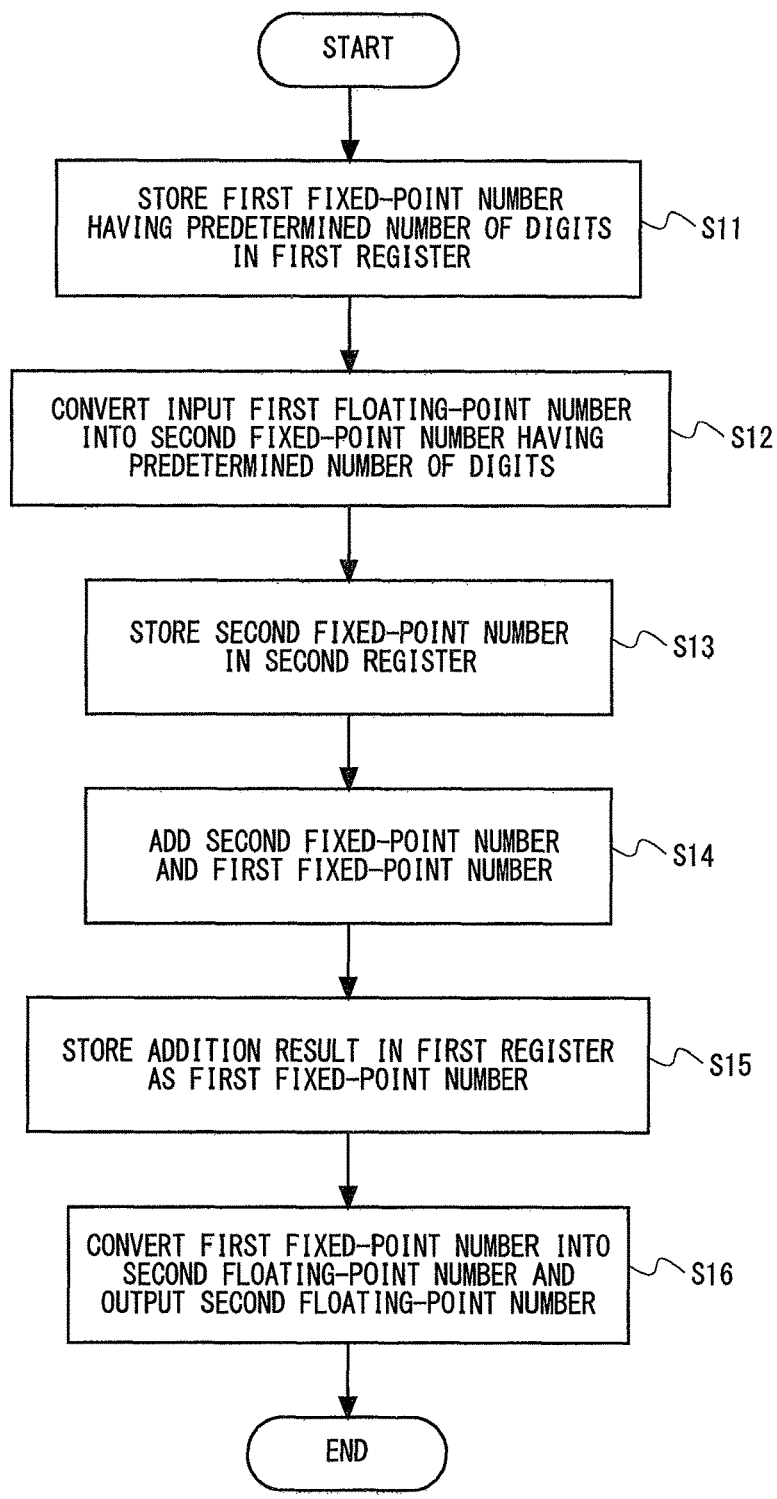
FIG. 2 is a flowchart showing a flow of floating-point addition processing according to the first embodiment.

FIG. 2 is a flowchart showing a flow of floating-point addition processing according to the first embodiment. First, the first fixed-point number 24 having the predetermined number of digits corresponding to the result of accumulation of the plurality of floating-point numbers is stored in the first register 14 (S11). Next, the first conversion unit 11 converts the input first floating-point number 21 into the second fixed-point number 23 having the predetermined number of digits (S12). The second fixed-point number 23 is stored in the second register 12 (S13).

Subsequently, the adder 13 adds the second fixed-point number 23 and the first fixed-point number 24 (S14). Further, the adder 13 stores the addition result in the first register 14 as the first fixed-point number 24 (S15). After that, the second conversion unit 15 converts the first fixed-point number 24 into the second floating-point number 22, and outputs the second floating-point number 22 (S16).

Thus, in the first embodiment, the following processing is carried out repeatedly. That is, the accumulation result (intermediate result) of a plurality of floating-point numbers is held as a fixed-point number (first fixed-point number 24); an input floating-point number to be subsequently added is converted into a fixed-point number (second fixed-point number 23) and is added to the held fixed-point number; and the addition result is held for the subsequent addition. Thus, the addition processing can be implemented in one cycle between the second register 12 and the first register 14. Further, the processing of adding the fixed-point numbers having a predetermined number of digits eliminates the need for a shifter for digit alignment. In other words, the repeated processing does not include any shift operation, which leads to a reduction in the path delay. Therefore, the processing of adding the floating-point numbers can be performed at a higher speed in comparison to that of Japanese Unexamined Patent Application Publication No. H11-102353 and that of the floating-point adder 900 described above.

Second Embodiment

Figure 3:
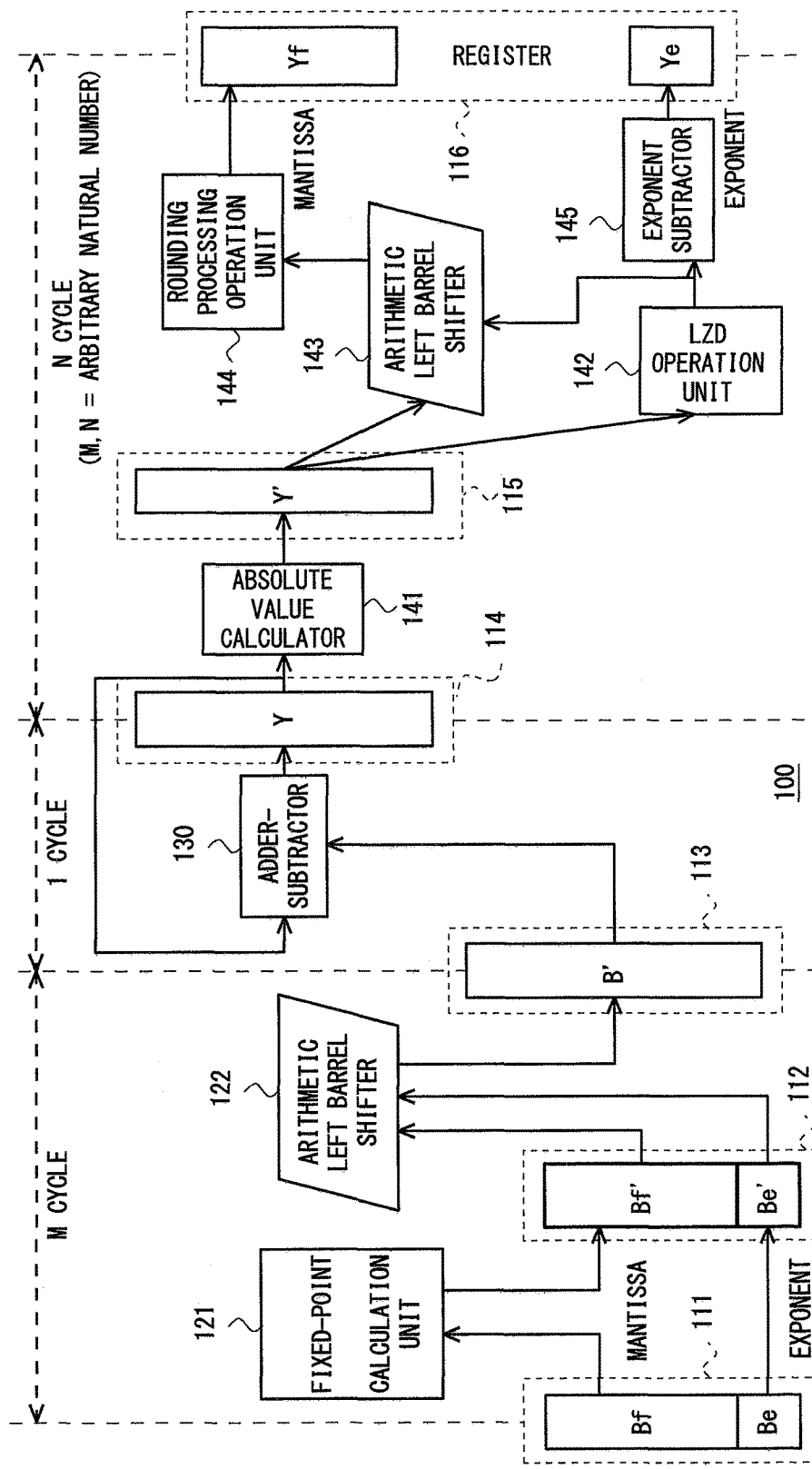
FIG. 3 is a block diagram showing a configuration of a floating-point adder according to a second embodiment.

FIG. 3 is a block diagram showing a configuration of a floating-point adder 100 according to a second embodiment. The floating-point adder 100 is an example of the floating-point adder 1 according to the first embodiment described above. The floating-point adder 100 continuously receives floating-point numbers and repeatedly performs addition processing, i.e., accumulates the floating-point numbers. In the following description, each floating-point number is represented in the IEEE 754 single-precision format. Accordingly, in the following description, each floating-point number is composed of a 1-bit sign part, an 8-bit exponent part, and a 23-bit mantissa part. The format and type of the floating-point number are not limited to these. In the following description, assume that M=2 and N=2 hold in FIG. 3. However, the values M and N are not limited to these values. In FIG. 3, the sign part is omitted.

The floating-point adder 100 includes registers 111 to 116, a signed fixed-point number calculation unit 121, an arithmetic left barrel shifter 122, an adder-subtractor 130, an absolute value calculator 141, a LZD operation unit 142, an arithmetic left barrel shifter 143, a rounding processing operation unit 144, and an exponent subtractor 145. The functional block including the signed fixed-point number calculation unit 121, the register 112, and the arithmetic left barrel shifter 122 is an example of the first conversion unit 11 described above. The functional block including the absolute value calculator 141, the register 115, the LZD operation unit 142, the arithmetic left barrel shifter 143, the rounding processing operation unit 144, and the exponent subtractor 145 is an example of the second conversion unit 15 described above.

The register 111 stores the mantissa part Bf and the exponent part Be of the input floating-point number. The register 112 stores a mantissa part Bf' and an exponent part Be' which are 25-bit signed fixed-point numbers. The register 113 stores a 279-bit signed fixed-point number B'. The register 113 is an example of the second register 12 described above, and the fixed-point number B' is an example of the second fixed-point number 23 described above. The register 114 stores a 279-bit fixed-point number Y as the accumulation result. The register 114 is an example of the first register 14 described above, and the fixed-point number Y is an example of the first fixed-point number 24 described above. The register 115 stores a 278-bit fixed-point number Y' as the absolute value of the fixed-point number Y. The register 116 stores the mantissa part Yf and the exponent part Ye of the floating-point number to be output. The register 111 and the register 116 are not essential components for the floating-point adder 100.

The signed fixed-point number calculation unit 121 extends the 23-bit mantissa part Bf stored in the register 111 into 24 bits. When the sign part of the input floating-point number indicates positive, the signed fixed-point number calculation unit 121 generates a 25-bit fixed-point number by adding 0 to the most significant bit. On the other hand, when the sign part of the input floating-point number indicates negative, the signed fixed-point number calculation unit 121 generates a 25-bit fixed-point number obtained by adding 0 to the most significant bit and multiplying the resultant by −1. In either case, the signed fixed-point number calculation unit 121 stores the generated 25-bit fixed-point number in the register 112 as the mantissa part Bf'.

The arithmetic left barrel shifter 122 locates the mantissa part Bf', which is the 25-bit fixed-point number stored in the register 112, at the rightmost position, and sign-extends the mantissa part Bf' into 279 bits. Further, the arithmetic left barrel shifter 122 shifts the fixed-point number obtained after the sign extension to the left by an amount corresponding to the value of the exponent part Be' stored in the register 112, and stores the result of the left shift in the register 113 as the 279-bit fixed-point number B'.

The adder-subtractor 130 performs addition/subtraction of the 279-bit signed fixed-point number B' stored in the register 113 and the 279-bit signed fixed-point number Y stored in the register 114, and stores the addition/subtraction result in the register 114 as the fixed-point number Y. In this case, when the sign of the fixed-point number B' is the same as the sign of the fixed-point number Y, the adder-subtractor 130 adds the fixed-point number B' and the fixed-point number Y. When the sign of the fixed-point number B' is different from the sign of the fixed-point number Y, the adder-subtractor 130 subtracts one of the fixed-point numbers B' and Y from the other one of the fixed-point numbers B' and Y.

The absolute value calculator 141 calculates a 278-bit unsigned fixed-point number as the absolute value of the 279-bit signed fixed-point number Y stored in the register 114, and stores the 278-bit unsigned fixed-point number in the register 115 as the fixed-point number Y'.

The LZD operation unit 142 measures the number of bits (the number of zero consecutive bits) including consecutive zeros starting from the most significant bit of the 278-bit fixed-point number Y' stored in the register 115, and outputs the number of bits. Note that the upper limit of the number of zero consecutive bits output from the LZD operation unit 142 is 254. Accordingly, if the measurement result shows that the number of zero consecutive bits is less than 254, the LZD operation unit 142 directly outputs the measured value as the number of zero consecutive bits. If the measurement result shows that the number of zero consecutive bits is equal to or greater than 254, the LZD operation unit 142 outputs 254 as the number of zero consecutive bits.

The arithmetic left barrel shifter 143 shifts the 278-bit fixed-point number Y', which is stored in the register 115, to the left by an amount corresponding to the number of zero consecutive bits output from the LZD operation unit 142. The rounding processing operation unit 144 performs rounding processing on the fixed-point number output from the arithmetic left barrel shifter 143, and stores the processing result in the register 116 as the mantissa part Yf. In this case, concerning the fixed-point number output from the arithmetic left barrel shifter 143, the rounding processing operation unit 144 determines whether there is a carry of the fractions from three bits between the 24th bit and the 26th bit starting from the most significant bit of the fixed-point number. When the rounding processing operation unit 144 determines that there is no carry of the fractions, the rounding processing operation unit 144 outputs the upper second to 24th bits of the fixed-point number. On the other hand, when the rounding processing operation unit 144 determines that there is a carry of the fractions, the rounding processing operation unit 144 adds the values, which indicate that the 24th bit is 1 and the other upper bits are 0, to the values of the extracted upper second to 24th bits of the fixed-point number, and outputs the addition result. The 23-bit fixed-point number output from the rounding processing operation unit 144 is the mantissa part Yf of the floating-point number which is the operation result of the floating-point adder 100.

The exponent subtractor 145 subtracts the number of zero consecutive bits output from the LZD operation unit 142 from the constant value 255. When the most significant bit of the fixed-point number output from the arithmetic left barrel shifter 143 is 1, the exponent subtractor 145 directly outputs the subtraction result. On the other hand, when the most significant bit of the fixed-point number output from the arithmetic left barrel shifter 143 is 0, the exponent subtractor 145 further subtracts 1 from the subtraction result and outputs the subtraction result. This output result is the exponent part Ye of the floating-point number which is the operation result of the floating-point adder 100.

Thus, in the second embodiment, the above-described processing corresponding to the first conversion unit 11 requires two clock cycles because data is stored in the register 112 and the register 113. Further, the above-described processing corresponding to the adder 13 requires one clock cycle because data is stored in the register 114. Furthermore, the above-described processing corresponding to the first register 14 requires two clock cycles because data is stored in the register 115 and the register 116. Accordingly, the second embodiment illustrates the case where the number of clock cycles M is 2 (M=2) and the number of clock cycles N is 2 (N=2).

Note that the second embodiment is not limited to the case where the number of clock cycles M is 2 (M=2) and the number of clock cycles N is 2 (N=2). For example, the number of clock cycles M may be set to 1 (M=1) by omitting the register 112, or the number of clock cycles N may be set to 1 (N=1) by omitting the register 115. In another alternative, the number of clock cycles M may be set to 3 or more by additionally providing one or more intermediate registers to the calculation unit between the register 111 and the register 112, or to the calculation unit between the register 112 and the register 113. Similarly, the number of clock cycles N may be set to 3 or more by additionally providing one or more intermediate registers to the calculation unit between the register 114 and the register 115, or to the calculation unit between the register 115 and the register 116.

Figure 4:
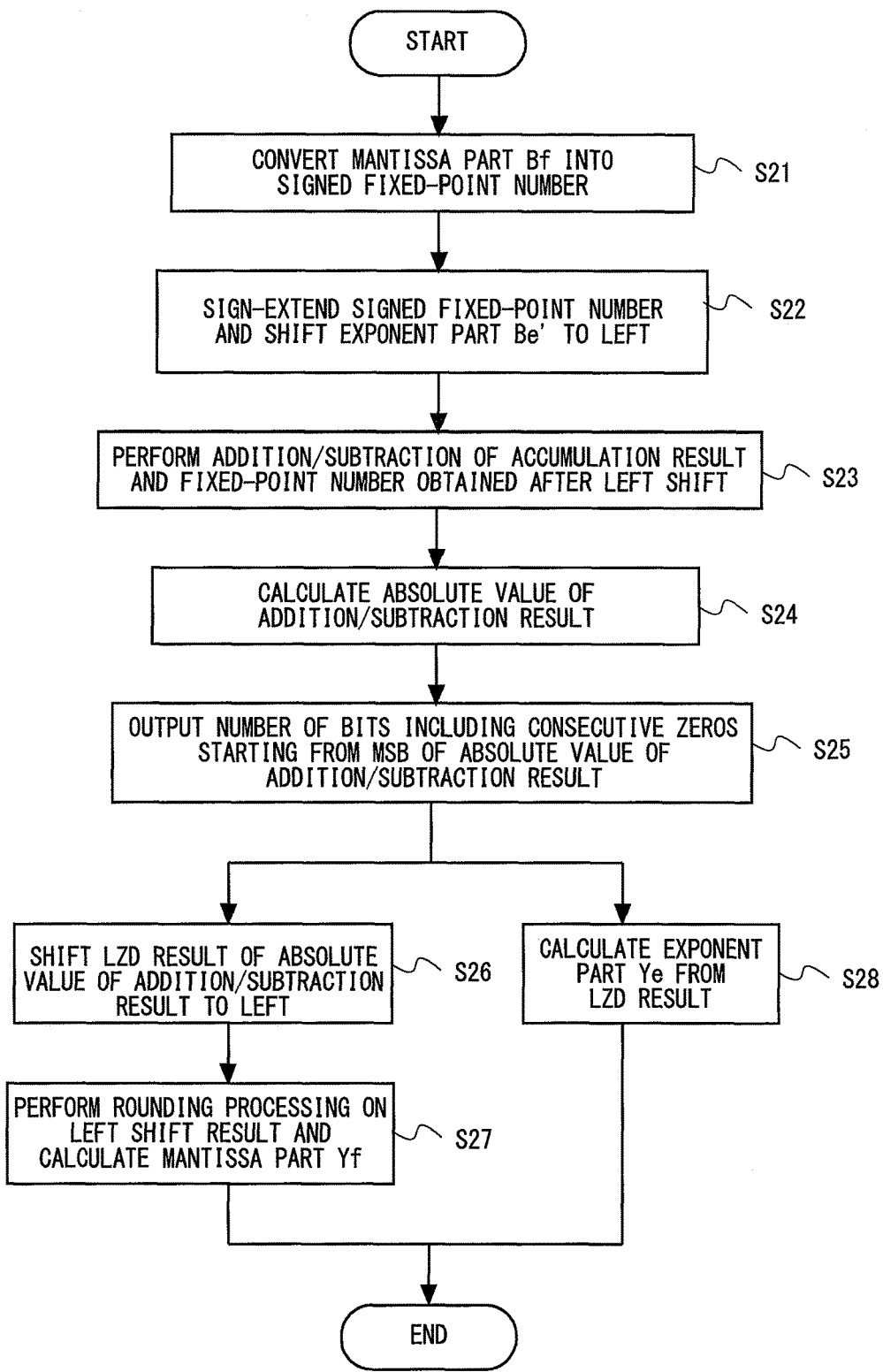
FIG. 4 is a flowchart showing a flow of floating-point addition processing according to the second embodiment.

FIG. 4 is a flowchart showing a flow of floating-point addition processing according to the second embodiment. Assume herein that the 279-bit signed fixed-point number Y corresponding to the result of accumulation of a plurality of floating-point numbers is stored in the register 114.

The signed fixed-point number calculation unit 121 converts the mantissa part Bf of the input floating-point number into a signed fixed-point number, and stores the signed fixed-point number in the register 112 as the mantissa part Bf' (S21). At this time, the exponent part Be of the floating-point number, which is input in parallel, is stored in the register 112 as the exponent part Be'.

Next, the arithmetic left barrel shifter 122 sign-extends the mantissa part Bf', which is the signed fixed-point number, shifts the exponent part Be' to the left, and stores the shift result in the register 113 as the fixed-point number B' (S22).

Next, the adder-subtractor 130 performs addition/subtraction of the accumulation result (fixed-point number Y) and the fixed-point number B' obtained after the left shift, and stores the addition/subtraction result in the register 114 as the fixed-point number Y (S23).

After that, the absolute value calculator 141 calculates the absolute value of the addition/subtraction result (fixed-point number Y), and stores the absolute value in the register 115 as the fixed-point number Y' (S24). Subsequently, the LZD operation unit 142 outputs the number of bits (the number of zero consecutive bits) including consecutive zeros starting from the most significant bit (MSB) of the absolute value of the addition/subtraction result (S25).

In this case, the arithmetic left barrel shifter 143 shifts the LZD result (the number of zero consecutive bits) of the absolute value of the addition/subtraction result to the left (S26). The rounding processing operation unit 144 performs rounding processing on the left shift result, calculates the mantissa part Yf, and outputs the mantissa part Yf (S27). In parallel, after step S25, the exponent subtractor 145 calculates the exponent part Ye from the LZD result, and outputs the exponent part Ye (S28).

FIG. 5 is a timing diagram showing a flow of floating-point addition processing according to the second embodiment. First, the floating-point adder 100 resets the values, which are stored in the registers 112 to 115, to 0.

In a first cycle, when the floating-point adder 100 receives an operand (which is a floating-point number; the same applies hereinafter) of a first accumulation instruction, the floating-point adder 100 performs an operation (calculation of a signed fixed-point number) between the input value and the register 112, and stores the operation result in the register 112 as intermediate data for the first accumulation instruction.

In a second cycle, when the floating-point adder 100 receives an operand of a second accumulation instruction, the floating-point adder 100 performs an operation (calculation of a signed-fixed point number) between the input value and the register 112, and stores the operation result in the register 112 as intermediate data for the second accumulation instruction. In parallel with the operation, the floating-point adder 100 performs an operation (arithmetic left shift) between the registers 112 and 113 on the intermediate data for the first accumulation instruction, and stores the operation result in the register 113 as intermediate data for the first accumulation instruction.

In a third cycle, when the floating-point adder 100 receives an operand of a third accumulation instruction, the floating-point adder 100 performs an operation (calculation of a signed fixed-point number) between the input value and the register 112, and stores the operation result in the register 112 as intermediate data for the third accumulation instruction. In parallel with the operation, the floating-point adder 100 performs an operation (arithmetic left shift) between the registers 112 and 113 on the intermediate data for the second accumulation instruction, and stores the operation result in the register 113 as intermediate data for the second accumulation instruction. Further, in parallel with the operation, the floating-point adder 100 performs addition/subtraction of the intermediate data for the first accumulation instruction and the initial value 0 stored in the register 114, and stores the addition/subtraction result in the register 114 as intermediate data for the first accumulation instruction.

In a fourth cycle, when the floating-point adder 100 receives an operand of a fourth accumulation instruction, the floating-point adder 100 performs an operation (calculation of a signed fixed-point number) between the input value and the register 112, and stores the operation result in the register 112 as intermediate data for the fourth accumulation instruction. In parallel with the operation, the floating-point adder 100 performs an operation (arithmetic left shift) between the registers 112 and 113 on the intermediate data for the third accumulation instruction, and stores the operation result in the register 113 as intermediate data for the third accumulation instruction. Further, in parallel with the operation, the floating-point adder 100 performs addition/subtraction of the intermediate data for the second accumulation instruction and the intermediate data for the first accumulation instruction stored in the register 114, and stores the addition/subtraction result (intermediate result of accumulation of the operands of the first accumulation instruction and the second accumulation instruction) in the register 114 as intermediate data for the second accumulation instruction. Further, in parallel with the operation, the floating-point adder 100 performs an operation (calculation of an absolute value) between the registers 114 and 115 on the intermediate data for the first accumulation instruction, and stores the operation result in the register 115 as intermediate data for the first accumulation instruction.

In a fifth cycle, when the floating-point adder 100 receives an operand of a fifth accumulation instruction, the floating-point adder 100 performs an operation (calculation of a signed fixed-point number) between the input value and the register 112, and stores the operation result in the register 112 as intermediate data for the fifth accumulation instruction. In parallel with the operation, the floating-point adder 100 performs an operation (arithmetic left shift) between the registers 112 and 113 on the intermediate data for the fourth accumulation instruction, and stores the operation result in the register 113 as intermediate data for the fourth accumulation instruction. Further, in parallel with the operation, the floating-point adder 100 performs addition/subtraction of the intermediate data for the second accumulation instruction and the intermediate data for the second accumulation instruction stored in the register 114, and stores the addition/subtraction result (intermediate result of accumulation of the operands of the first to third accumulation instructions) in the register 114 as intermediate data for the third accumulation instruction. Furthermore, in parallel with the operation, the floating-point adder 100 performs an operation (calculation of an absolute value) between the registers 114 and 115 on the intermediate data for the second accumulation instruction, and stores the intermediate data for the second accumulation instruction in the register 115. Moreover, in parallel with the operation, the floating-point adder 100 performs operations (LZD, arithmetic left shift, rounding processing, and exponent subtraction) between the register 115 and the output on the intermediate data for the first accumulation instruction, and outputs the operation results for the first accumulation instruction.

In sixth and subsequent cycles, operations similar to the operations in the fifth cycle are continuously performed. Specifically, intermediate data for accumulation results from the first accumulation instruction is stored in the register 114, and the operation between the registers 114 and 115 and the operation between the register 115 and the output are performed in the subsequent two cycles. After that, the accumulation results from the first accumulation instruction are output.

Advantageous Effects of Second Embodiment

As described above, the floating-point adder 100 according the second embodiment executes addition/subtraction processing on two operands (fixed-point numbers) between the registers 113 and 114 every cycle. Accordingly, the processing of accumulating a plurality of floating-point numbers can be executed substantially every cycle. This makes it possible to speed up the processing of accumulating a plurality of floating-point numbers.

Figure 6:
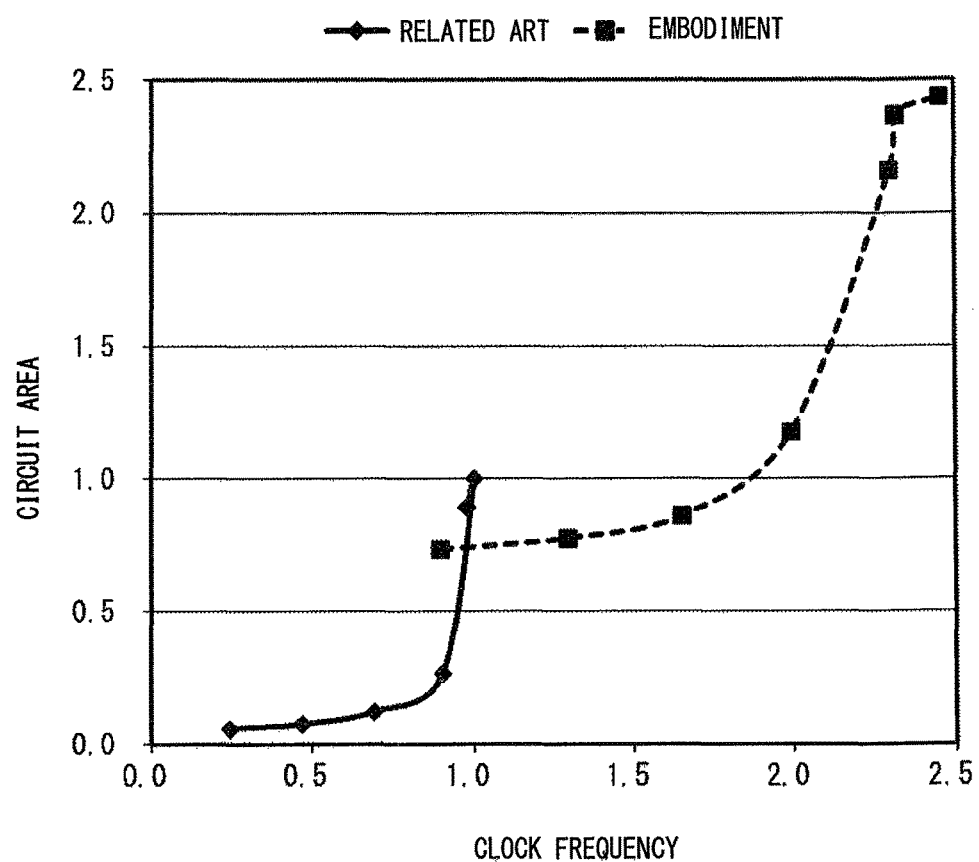
FIG. 6 is a graph showing a correlation between an area and a maximum operating frequency of the floating-point adder according to the second embodiment and that of related art.

FIG. 6 is a graph showing a correlation between an area and a maximum operating frequency of the floating-point adder according to the second embodiment and that of related art. In the correlation graph, the vertical axis represents the circuit area of the floating-point adder, and the horizontal axis represents the clock frequency of the floating-point adder. Note that the circuit area and the clock frequency are determined assuming that the maximum clock frequency of the related art is 1.0.

When the clock frequency of the related art is compared with the clock frequency of the second embodiment, the maximum clock frequency of the second embodiment is 2.5 times that of the related art, which indicates that the second embodiment has the above-mentioned advantageous effect. In particular, when the circuit area is 1.0, the clock frequency of the second embodiment is about 2.0 times that of the related art.

The second embodiment has another advantageous effect that the effective precision of accumulation of floating-point numbers is increased. The system of the related art limits the range of the addition/subtraction of mantissas to about 26 bits. Accordingly, in the related art, information about the digits of bits in the range from the upper bits of significant digits to the bits whose positions are lower than the range of addition/subtraction is lost due to the rounding processing. For example, a case of adding 16 times the values 1.00 . . . 01×2 which are raised to the power of zero indicates to multiply by 16 (=the fourth power of 2), so that the fourth power of 1.00 . . . 01×2 is obtained. However, in the addition of the related art, the values 1.00 . . . 01×2 which are raised to the power of 1 are obtained in the second accumulation, and after that, the value "1" in the lowest digit of the mantissa is rounded in the third and subsequent accumulations. In a round-down method, the fourth power of 1.00 . . . 00×2 is finally obtained and the obtained result is away from the original operation result. On the other hand, all bits are stored in the floating-point adder 100 according to the second embodiment, thereby preventing a deterioration in the precision of the operation. Therefore, the above-mentioned advantageous effect can be obtained.

Some of the features of the second embodiment can be expressed as follows. That is, the first conversion unit desirably includes: a fixed-point calculation unit that converts a mantissa part of the first floating-point number into a signed third fixed-point number; and a first left shifter that sign-extends the third fixed-point number into the predetermined number of digits, shifts a number of bits corresponding to a value of an exponent part of the first floating-point number to the left, and outputs the shift result as the second fixed-point number. This configuration enables a calculation of a fixed-point number in which the information about the sign part and the exponent part is reflected in the mantissa part of the input floating-point number, and also enables addition/subtraction processing while maintaining the information about the input floating-point number.

The predetermined number of digits is desirably a total value of the number of digits of the sign part of the first floating-point number, the number of digits of the mantissa part, and the number of bits corresponding to the value of the exponent part. With this configuration, the information about the floating-point number can be maintained with a minimum number of digits.

Further, the second conversion unit desirably includes: an absolute value calculation unit that calculates an absolute value of the first fixed-point number stored in the first register; a LZD (Leading-Zero Detector) operation unit that measures the number of bits including consecutive zeros starting from a most significant bit of the absolute value; a second left shifter that shifts the absolute value to the left by an amount corresponding to the number of bits; a rounding processing operation unit that performs rounding processing on a result of the left shift and outputs a result of the rounding processing as a mantissa part of the second floating-point number; and an exponent subtractor that subtracts the number of bits from a predetermined constant value and outputs a result of the subtraction as an exponent part of the second floating-point number. With this configuration, the converted fixed-point number can be restored while the information about the original floating-point number is maintained. In addition, the result of addition/subtraction of fixed-point numbers can be converted into a floating-point number with high precision.

The second embodiment can also be expressed as follows. That is, it is desirable to convert the mantissa part of the first floating-point number into a signed third fixed-point number, sign-extend the third fixed-point number to the predetermined number of digits, shift the number of bits corresponding to the value of the exponent part of the first floating-point number to the left, and output a result of the left shift as the second fixed-point number. This configuration enables a calculation of a fixed-point number in which the information about the sign part and the exponent part is reflected in the mantissa part of the input floating-point number, and also enables addition/subtraction processing while the information about the input floating-point number is maintained.

It is also desirable to calculate an absolute value of the first fixed-point number stored in the first register, measure the number of bits including consecutive zeros starting from the most significant bit of the absolute value, shift the absolute value to the left by an amount corresponding to then number of bits, perform rounding processing on a result of the left shift, output a result of the rounding processing as the mantissa part of the second floating-point number, subtract the number of bits from a predetermined constant value, and output a result of the subtraction as the exponent part of the second floating-point number. The converted fixed-point number can be restored while the information about the original floating-point number is maintained. In addition, the result of addition/subtraction of fixed-point numbers can be converted into a floating-point number with high precision.

It can also be said that a third floating-point number input as an object to be added to the first floating-point number is converted into a third fixed-point number having the predetermined number of digits; the third fixed-point number is stored in the second register; the third fixed-point number and the first fixed-point number are added; and a result of the addition is stored in the first register as the first fixed-point number. With this configuration, the accumulation of the fixed-point numbers can be efficiently executed on the sequentially input floating-point numbers.

The second embodiment can also be expressed as follows. That is, the floating-point accumulator receives one floating-point number. The floating-point accumulator includes: a register (Y) that stores a first fixed-point number as a result of accumulation; a fixed-point calculation unit that converts a mantissa part of the input first floating-point number into a signed second fixed-point number and outputs the second fixed-point number; a first arithmetic left barrel shifter that sign-extends the second fixed-point number, shifts a number of bits corresponding to a value of an exponent part of the floating-point number to the left, and outputs a third fixed-point number; an adder-subtractor that adds the third fixed-point number and the first fixed-point number as the accumulation result, outputs a new accumulation result, and stores the accumulation result in the register; an absolute value calculation unit that calculates an absolute value of the first fixed-point number stored in the register, and outputs the absolute value; a LZD (Leading-Zero Detector) operation unit that measures the number of bits including consecutive zeros starting from a most significant bit of the absolute value; a second arithmetic left barrel shifter that shifts the absolute value to the left by an amount corresponding to the number of bits, and outputs a mantissa part of a second floating-point number as an accumulation result; a subtractor that subtracts the number of bits from a constant value, and outputs an exponent part of the second floating-point number; and a rounding operation unit that performs rounding processing on the mantissa part of the second floating-point number.

Third Embodiment

In the second embodiment described above, the number of bits of data to be operated by the adder-subtractor 130 is large, i.e., 278 bits. It is known that the number of logic stages required for a high-speed adder is proportional to the logarithm of the number of bits, and thus a high-speed accumulator can also be obtained in the second embodiment. However, in order to obtain a higher-speed accumulator, this stage may be a hindrance in some cases. Accordingly, in a third embodiment, the registers 113 and 114, which are intermediate registers, and the adder-subtractor 130 are each divided into a predetermined number of parts with a predetermined bit width, to thereby further speedup the processing of the adder-subtractor in comparison to the second embodiment.

Figure 7:
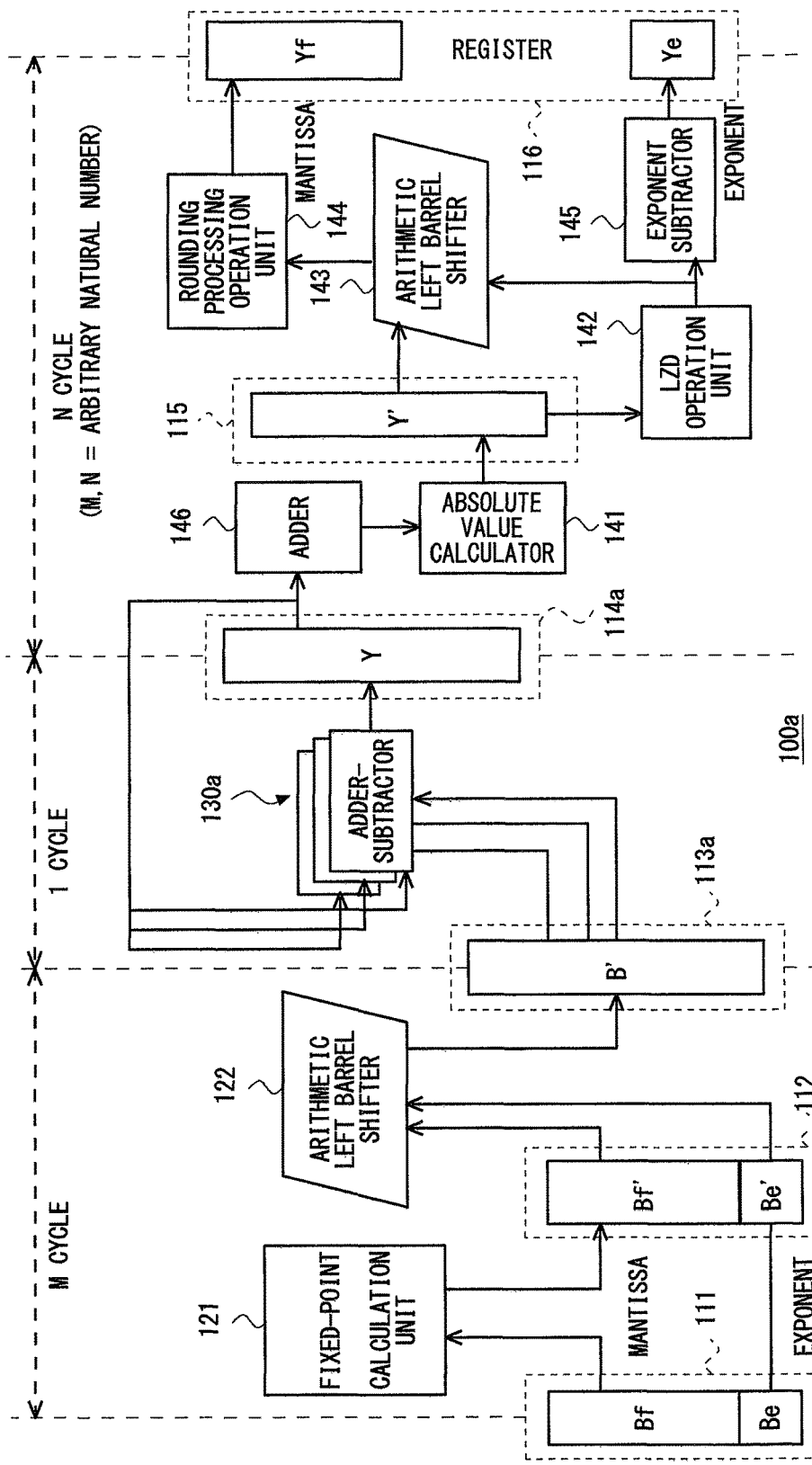
FIG. 7 is a block diagram showing a configuration of a floating-point adder according to a third embodiment.

FIG. 7 is a block diagram showing a configuration of a floating-point adder 100a according to the third embodiment. The floating-point adder 100a differs from the floating-point adder 100 according to the second embodiment in that the registers 113 and 114 and the adder-subtractor 130 are replaced by registers 113a and 114a and an adder-subtractor 130a, respectively, and an adder 146 is added.

Figure 8:
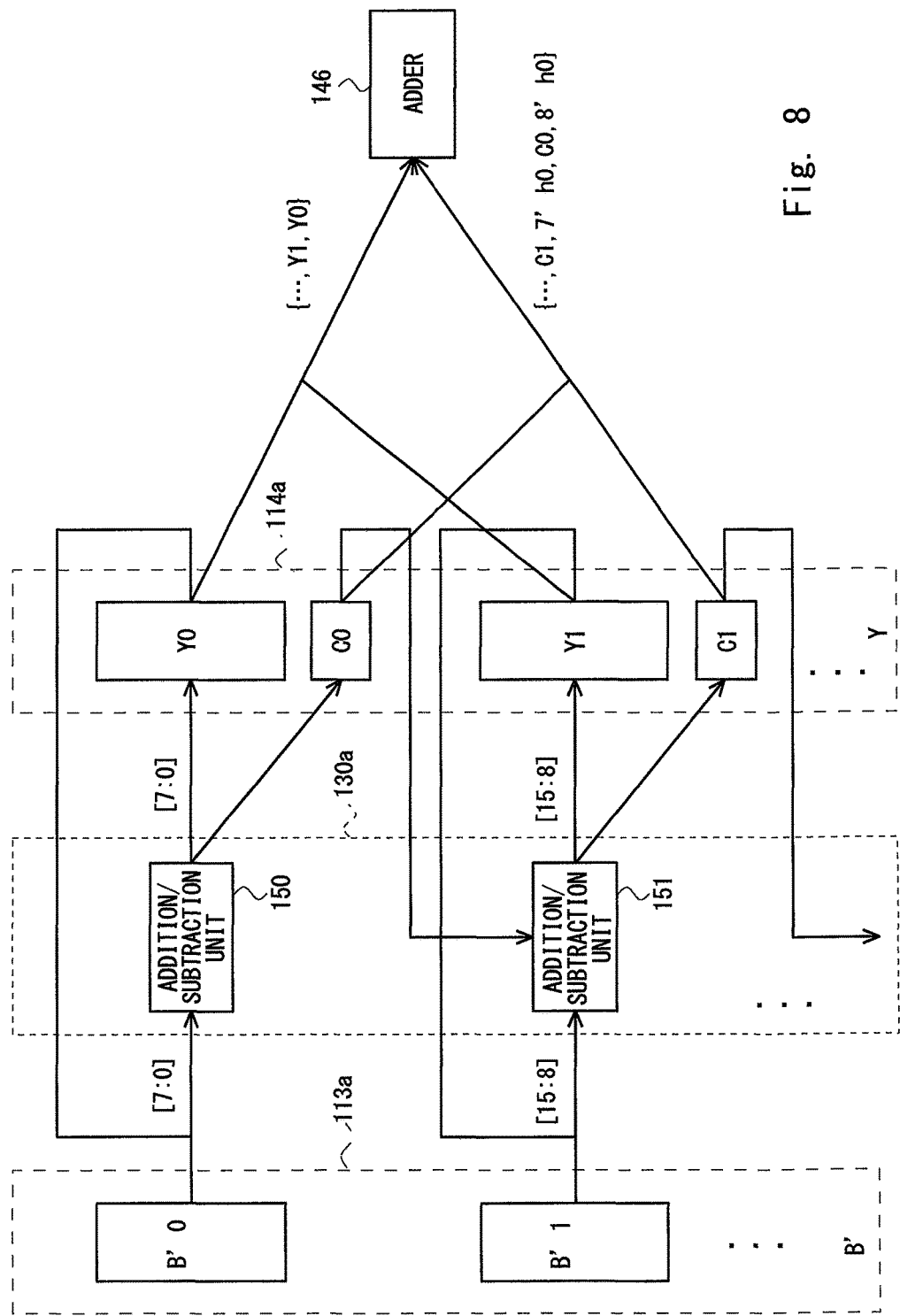
FIG. 8 is a block diagram showing configurations of an intermediate register (B'), an adder-subtractor, an intermediate register (Y), and an adder according to the third embodiment.

FIG. 8 is a block diagram showing the configurations of the register 113a (B'), the adder-subtractor 130a, the register 114a (Y), and the adder 146 according to the third embodiment. FIG. 8 shows a specific example of a case where the registers and the adder-subtractor are each divided into parts with a bit width of 8 bits.

The register 113a has a configuration in which 278 bits are divided into groups of 8 bits from the least significant bit to obtain 35 sub-registers (which are an example of second sub-registers). In other words, the register 113a includes a predetermined number of (35) second sub-registers having a predetermined bit width (8-bit width). Specifically, the register 113a is divided into intermediate registers which are respectively represented by B'0 (from the least significant (0th) bit to the seventh bit: The register 114a has a configuration in which 278 bits are divided into groups of 8 bits from the least significant bit to obtain 35 sub-registers (which are an example of first sub-registers), and carry intermediate registers (C0, C1, . . . , and C34) that store 35 pieces of carry information are incorporated. In other words, the register 114a includes a predetermined number of first sub-registers having a predetermined bit width, and a predetermined number of carry registers that store the predetermined number of pieces of carry information.

The adder-subtractor 130a includes 35 addition/subtraction units 150, 151, . . . which perform addition/subtraction in units of 8 bits. Each of the addition/subtraction units 150, 151, . . . adds values at corresponding bit positions of the first sub-register and the second sub-register. Each addition/subtraction unit is an example of the predetermined number of sub-adders. Each addition/subtraction unit receives the sub-register value corresponding to the last figure of the sign (which is referred to as a "suffix" for convenience of explanation), and the value of the corresponding carry intermediate register having a suffix which is smaller by 1 than the suffix of each addition/subtraction unit. For example, the addition/subtraction unit 150 shown in FIG. 8 has, as an input, the values of the sub-registers B'0 and Y0 which have the same suffix (0). Since there is no carry intermediate register having a suffix (−1) which is smaller by 1 than the suffix of the addition/subtraction unit, the input of the carry intermediate register is none. The addition/subtraction unit 151 has, as an input, the values of the sub-registers B'1 and Y1 which have the same suffix (1) and the value of the carry intermediate register C0 having the suffix (0) which is smaller by 1 than the suffix (1) of the addition/subtraction unit 151.

The output of each addition/subtraction unit is stored in the corresponding sub-register (Y0, Y1, . . . , and Y34) included in the register 114a(Y) having the same suffix, and information about the carry of the most significant bit of each addition/subtraction unit is stored in the corresponding carry intermediate register (C0, C1, . . . , and C34) included in the register 114a (Y).

In other words, each sub-adder adds the value stored in the corresponding first sub-register, the value stored in the corresponding second sub-register, and the carry information stored in the corresponding carry register in a bit lower than the corresponding first sub-register, and updates the corresponding first sub-register and the corresponding carry register. These configurations enable the repetition of addition/subtraction processing at a higher speed than that in the second embodiment.

While the above embodiment illustrates an example in which each register is divided into groups of 8 bits, the number of bits into which each register is divided is not limited to 8 bits.

The adder 146 receives the values of the sub-registers (Y0, Y1, . . . , and Y34) included in the register 114a(Y) and the values of the carry intermediate registers (C0, C1, . . . , and C34) included in the register 114a (Y). One of the operation data received by the adder 146 is the number ({Y34, . . . , Y1, Y0}) obtained by connecting the values of the sub-registers, and the other of the operation data received by the adder 146 is the number ({C34, 5'h0, C33, 7'h0, C32, . . . , C2, 7'h0, C1, 7'h0, C0, 8'h0}, where "n'h0" represents n-bit zero) obtained by locating the values of the carry intermediate registers in the respective bit positions. The addition result output from the adder 146 is equal to the value stored in the register 114 of the second embodiment.

In other words, the second conversion unit generates a fourth fixed-point number having the predetermined number of digits by connecting, in an order of a bit sequence, values stored in the predetermined number of first sub-registers, generates a fifth fixed-point number having the predetermined number of digits by locating values stored in the predetermined number of carry registers in respective bit positions, adds the fourth fixed-point number and the fifth fixed-point number, converts a result of the addition into the second floating-point number, and outputs the second floating-point number. With this configuration, the fixed-point numbers divided for high-speed operation can be appropriately connected to each other, and thus the precision of the operation can be maintained.

Figure 9:
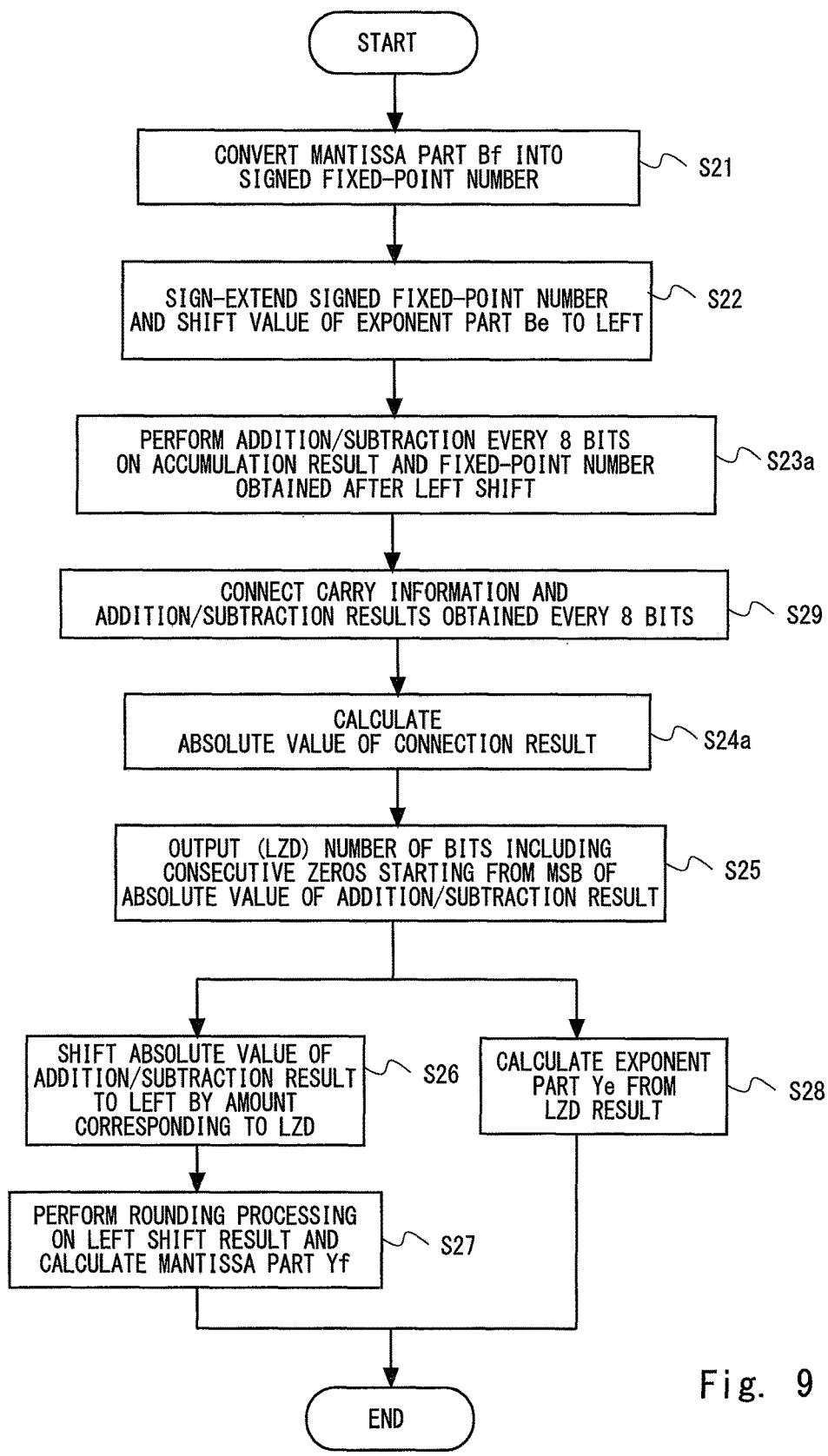
FIG. 9 is a flowchart showing a flow of floating-point addition processing according to the third embodiment.

FIG. 9 is a flowchart showing a flow of floating-point addition processing according to the third embodiment. FIG. 9 differs from FIG. 4 described above in that steps S23 and S24 are replaced by steps S23a, S29, and S24a. The other steps in FIG. 9 are similar to those in FIG. 4, and thus the descriptions thereof are omitted.

In step S23a, the adder-subtractor 130a performs addition/subtraction in units of 8 bits on the accumulation result and the fixed-point number obtained after the left shift. The adder 146 connects the carry information to the addition/subtraction results obtained every 8 bits (S29). After that, the absolute value calculator 141 calculates the absolute value of the connection result (S24a).

Specifically, the adder-subtractor 130a adds the value stored in a specific first sub-register, the value stored in the second sub-register corresponding to the specific first sub-register, and the carry information stored in the corresponding carry register in a bit lower than the specific first sub-register, and updates the corresponding first sub-register and the corresponding carry register. This configuration enables the repetition of addition/subtraction processing at a higher speed than that in the second embodiment.

Further, the second conversion unit 15 including the adder 146 generates the fourth fixed-point number having the predetermined number of digits by connecting, in an order of a bit sequence, values stored in the predetermined number of first sub-registers, generates the fifth fixed-point number having the predetermined number of digits by locating values stored in the predetermined number of carry registers in respective bit positions, adds the fourth fixed-point number and the fifth fixed-point number, converts a result of the addition into the second floating-point number, and outputs the second floating-point number. With this configuration, the fixed-point numbers divided for high-speed operation can be appropriately connected to each other, and thus the precision of the operation can be maintained.

Advantageous Effects of Third Embodiment

The floating-point adder 100a according to the third embodiment has an advantageous effect that an accumulator that operates at a clock frequency higher than that of the floating-point adder 100 of the second embodiment can be obtained by reducing a delay in the adder-subtractor 130a between the registers 113a and 114a. In this case, it can be assumed that a part of the addition/subtraction processing between the registers 113 and 114 in the second embodiment is transferred to the addition processing between the registers 114a and 115 in the third embodiment. In this case, however, since the number of divided pipeline stages between the registers 114a and 115 has no influence on the accumulation operation performance, the above-mentioned advantageous effect can be obtained.

Other Embodiments

The floating-point adders according to the embodiments described above can be mounted on semiconductor devices. This configuration makes it possible to speed up various operation processes including vector operations.

In the above embodiment, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, DVD (Digital Versatile Disc), BD (Blu-ray® Disc), and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line, such as electric wires and optical fibers, or a wireless communication line.

The invention made by the present inventor has been described in detail above based on the embodiments of the invention. However, the present invention is not limited to the embodiments described above and can be modified in various ways without departing from the scope of the invention.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An image recognition device that acquires image information of an image including an object to be recognized, executes recognition processing to recognize the object from a plurality of feature vectors of the image information, wherein the plurality of feature vectors is represented by floating-point numbers, the image recognition device comprising:
a floating point adder that includes:
a first register that stores a first fixed-point number having a first predetermined number of digits;
a first conversion unit configured to convert an input first floating-point number into a second fixed-point number having the first predetermined number of digits;
a second register that stores the second fixed-point number;
an adder that is connected to the first register and the second register as inputs of the adder, is further connected to the first register as output of the adder, adds the second fixed-point number stored in the second register and the first fixed-point number stored in the first register, and stores the output of the adder in the first register to accumulate a plurality of floating point numbers, the input first floating-point number being accumulated as one of the plurality of floating point numbers; and
a second conversion unit configured to convert the first fixed-point number stored in the first register into a second floating-point number and output the second floating-point number,
wherein the first conversion unit is further configured to convert a mantissa part of the input first floating-point number into a signed third fixed-point number, and sign-extend the signed third fixed-point number into the first predetermined number of digits,
wherein a first left shifter of the first conversion unit is configured to shift the sign-extended third fixed-point number to the left by a number of bits corresponding to a value of an exponent part of the input first floating-point number, and output the shifted third fixed-point number as the second fixed-point number, and
wherein the first predetermined number of digits is a total value of a number of digits of a sign part of the input first floating-point number, a number of digits of the mantissa part of the input first floating-point number, and a number of bits corresponding to the value of the exponent part of the input first floating-point number.

2. The image recognition device according to claim 1, wherein
the first register includes a second predetermined number of first sub-registers having a predetermined bit width, and a third predetermined number of carry registers configured to store pieces of carry information,
the second register includes a fourth predetermined number of second sub-registers having the predetermined bit width,
the adder includes a fifth predetermined number of sub-adders configured to add values at corresponding bit positions of the respective first sub-registers and the second sub-registers, and
each of the fifth predetermined number of sub-adders adds a value stored in a corresponding first sub-register, a value stored in a corresponding second sub-register, and the carry information stored in a corresponding carry register in a bit lower than the corresponding first sub-register, and updates the corresponding first sub-register and the corresponding carry register.

3. The image recognition device according to claim 2, wherein the second conversion unit is configured to:
generate a fourth fixed-point number having the first predetermined number of digits by connecting, in an order of a bit sequence, values stored in the second predetermined number of first sub-registers,
generate a fifth fixed-point number having the predetermined number of digits by locating values stored in the third predetermined number of carry registers in respective bit positions,
add the fourth fixed-point number and the fifth fixed-point number, and
convert the added number into the second floating-point number and outputs the second floating-point number.

4. The image recognition device according to claim 1, wherein the second conversion unit is further configured to:
calculate an absolute value of the first fixed-point number stored in the first register, and measure a number of bits including consecutive zeros starting from a most significant bit of the absolute value,
wherein a second left shifter of the second conversion unit is configured to shift the absolute value to the left by the measured number of bits,
wherein the second conversion unit is further configured to:
perform rounding processing on the left shifted absolute value, and output the left shifted absolute value after performing the rounding processing as a mantissa part of the second floating-point number, and
subtract the measured number of bits from a predetermined constant value, and output the subtracted value as an exponent part of the second floating-point number.

5. A control method for an image recognition device that acquires image information of an image including an object to be recognized, executes recognition processing to recognize the object from a plurality of feature vectors of the image information, wherein the plurality of feature vectors are represented by floating-point numbers, the control method, comprising:
storing, in a first register, a first fixed-point number having a first predetermined number of digits previously accumulated a plurality of floating-point numbers;
converting an input first floating-point number into a second fixed-point number having the first predetermined number of digits;
storing, in a second register, the second fixed-point number;
adding the second fixed-point number stored in the second register and the first fixed-point number stored in the first register, and storing the added first fixed-point number in the first register; and
converting the first fixed-point number into a second floating-point number and outputting the second floating-point number,
wherein the converting of the input first floating-point number into the second fixed-point number includes:
converting a mantissa part of the input first floating-point number into a signed third fixed-point number,
sign-extending the signed third fixed-point number into the first predetermined number of digits,
shifting the sign-extended third fixed-point number to the left by a number of bits corresponding to a value of an exponent part of the input first floating-point number, and
outputting the shifted third fixed-point number as the second fixed-point number,
wherein the first predetermined number of digits is a total value of a number of digits of a sign part of the first floating-point number, the number of digits of the mantissa part of the input first floating-point number, and the number of bits corresponding to the value of the exponent part of the input first floating-point number.

6. The control method according to claim 5, wherein
the first register includes a second predetermined number of first sub-registers having a predetermined bit width, and a third predetermined number of carry registers configured to store pieces of carry information,
the second register includes a fourth predetermined number of second sub-registers having the predetermined bit width, and
a value stored in a specific first sub-register, a value stored in the second sub-register corresponding to the specific first sub-register, and the carry information stored in the corresponding carry register in a bit lower than the specific first sub-register are added to update the corresponding first sub-register and the corresponding carry register.

7. The control method according to claim 6, wherein the converting of the first fixed-point number into the second floating-point number and the outputting of the second floating-point number includes:
generating a fourth fixed-point number having the first predetermined number of digits by connecting, in an order of a bit sequence, values stored in the second predetermined number of first sub-registers;
generating a fifth fixed-point number having the first predetermined number of digits by locating values stored in the third predetermined number of carry registers in respective bit positions;
adding the fourth fixed-point number and the fifth fixed-point number; and
converting the added number into the second floating-point number and outputting the second floating-point number.

8. The control method according to claim 5, wherein the converting of the first fixed-point number into the second floating-point number and the outputting of the second floating-point number includes:
calculating an absolute value of the first fixed-point number stored in the first register;
measuring a number of bits including consecutive zeros starting from a most significant bit of the absolute value;
shifting the absolute value to the left by the measured number of bits;
performing rounding processing on the left shifted absolute value, and outputting the left shifted absolute value after performing the rounding processing as a mantissa part of the second floating-point number; and
subtracting the measured number of bits from a predetermined constant value, and outputting the subtracted value as an exponent part of the second floating-point number.

9. The control method according to claim 5, further comprising:
converting a third floating-point number into a third fixed-point number having the first predetermined number of digits, the third floating-point number being input as an object to be added to the first floating-point number;

storing the third fixed-point number into the second register; and adding the third fixed-point number and the first fixed-point number and storing the added number in the first register as the first fixed-point number.

10. A floating point adder comprising:

a first register that stores a first fixed-point number having a first predetermined number of digits previously accumulated a plurality of floating-point numbers;

a first conversion unit configured to convert an input first floating-point number into a second fixed-point number having the first predetermined number of digits;

a second register that stores the second fixed-point number;

an adder that adds the second fixed-point number stored in the second register and the first fixed-point number stored in the first register, and stores a the added first fixed-point number in the first register; and a second conversion unit configured to convert the first fixed-point number into a second floating-point number and output the second floating-point number, wherein the first conversion unit is further configured to convert a mantissa part of the input first floating-point number into a signed third fixed-point number, and sign-extend the signed third fixed-point number into the first predetermined number of digits, wherein a first left shifter of the first conversion unit is configured to shift the sign-extended third fixed-point number to the left by a number of bits corresponding to a value of an exponent part of the input first floating-point number, and output the shifted third fixed-point number as the second fixed-point number, and wherein the first predetermined number of digits is a total value of a number of digits of a sign part of the input first floating-point number, a number of digits of the mantissa part of the input first floating-point number, and a number of bits corresponding to the value of the exponent part of the input first floating-point number.

11. The floating point adder according to claim 10, wherein the second conversion unit is further configured to:

calculate an absolute value of the first fixed-point number stored in the first register, and measure a number of bits including consecutive zeros starting from a most significant bit of the absolute value, wherein a second left shifter of the second conversion unit is configured to shift the absolute value to the left by the measured number of bits, wherein the second conversion unit is further configured to:

perform rounding processing on the left shifted absolute value, and output the left shifted absolute value after performing the rounding processing as a mantissa part of the second floating-point number, and subtract the measured number of bits from a predetermined constant value, and output the subtracted value as an exponent part of the second floating-point number.

\* \* \* \* \*